United States Patent
Zou et al.

(10) Patent No.: US 10,224,307 B2
(45) Date of Patent: Mar. 5, 2019

(54) ASSEMBLING METHOD, MANUFACTURING METHOD, DEVICE AND ELECTRONIC APPARATUS OF FLIP-DIE

(71) Applicant: Goertek, Inc., Weifang, Shandong (CN)

(72) Inventors: Quanbo Zou, Weifang (CN); Zhe Wang, Weifang (CN)

(73) Assignee: GOERTEK, INC., Weifang, Shandong (CN)

( * ) Notice: Subject to any disclaimer, the term of this patent is extended or adjusted under 35 U.S.C. 154(b) by 0 days.

(21) Appl. No.: 15/531,243

(22) PCT Filed: Jul. 14, 2015

(86) PCT No.: PCT/CN2015/083983
§ 371 (c)(1),
(2) Date: May 26, 2017

(87) PCT Pub. No.: WO2017/008251
PCT Pub. Date: Jan. 19, 2017

(65) Prior Publication Data
US 2017/0330856 A1    Nov. 16, 2017

(51) Int. Cl.
*H01L 33/62* (2010.01)
*H01L 23/00* (2006.01)
(Continued)

(52) U.S. Cl.
CPC .............. *H01L 24/97* (2013.01); *H01L 21/50* (2013.01); *H01L 21/6835* (2013.01);
(Continued)

(58) Field of Classification Search
CPC ......... H01L 24/97; H01L 24/81; H01L 24/83; H01L 2224/81143; H01L 2224/81;
(Continued)

(56) References Cited

U.S. PATENT DOCUMENTS 5,258,577 A * 11/1993 Clements ............ H01L 23/4828
174/259
2002/0173077 A1    11/2002 Ho et al.
(Continued)

FOREIGN PATENT DOCUMENTS

CN            1564331 A        1/2005
CN          101114683 A        1/2008
(Continued)

*Primary Examiner* — Caridad Everhart
(74) *Attorney, Agent, or Firm* — Hultquist, PLLC; Steven J. Hultquist

(57) ABSTRACT

The present invention discloses a assembling method, a manufacturing method, an device and an electronic apparatus of flip-die. The method for assembling a flip-die, comprises: temporarily bonding the flip-die onto a laser-transparent first substrate, wherein bumps of the flip-die are located on the side of the flip-die opposite to the first substrate; aligning the bumps with pads on a receiving substrate; irradiating the original substrate with laser from the first substrate side to lift-off the flip-die from the first substrate; and attaching the flip-die on the receiving substrate. A faster assembly rate can be achieved by using the present invention. A smaller chip size can be achieved by using the present invention. A lower profile can be achieved by using the present invention.

15 Claims, 5 Drawing Sheets

(51) Int. Cl.
*H01L 21/50* (2006.01)
*H01L 21/66* (2006.01)
*H01L 25/075* (2006.01)
*H01L 21/683* (2006.01)

(52) U.S. Cl.
CPC .............. *H01L 22/14* (2013.01); *H01L 24/81* (2013.01); *H01L 24/83* (2013.01); *H01L 24/92* (2013.01); *H01L 24/94* (2013.01); *H01L 25/0753* (2013.01); *H01L 33/62* (2013.01); *H01L 24/13* (2013.01); *H01L 24/16* (2013.01); *H01L 24/29* (2013.01); *H01L 24/32* (2013.01); *H01L 2221/68318* (2013.01); *H01L 2221/68327* (2013.01); *H01L 2221/68354* (2013.01); *H01L 2221/68381* (2013.01); *H01L 2224/131* (2013.01); *H01L 2224/16227* (2013.01); *H01L 2224/293* (2013.01); *H01L 2224/2929* (2013.01); *H01L 2224/2939* (2013.01); *H01L 2224/29294* (2013.01); *H01L 2224/32013* (2013.01); *H01L 2224/32225* (2013.01); *H01L 2224/73204* (2013.01); *H01L 2224/81005* (2013.01); *H01L 2224/81011* (2013.01); *H01L 2224/81121* (2013.01); *H01L 2224/81143* (2013.01); *H01L 2224/81191* (2013.01); *H01L 2224/81815* (2013.01); *H01L 2224/81903* (2013.01); *H01L 2224/81907* (2013.01); *H01L 2224/83005* (2013.01); *H01L 2224/83101* (2013.01); *H01L 2224/83143* (2013.01); *H01L 2224/83851* (2013.01); *H01L 2224/83855* (2013.01); *H01L 2224/92* (2013.01); *H01L 2224/9211* (2013.01); *H01L 2224/92125* (2013.01); *H01L 2224/94* (2013.01); *H01L 2224/95001* (2013.01); *H01L 2224/95144* (2013.01); *H01L 2224/95145* (2013.01); *H01L 2224/97* (2013.01); *H01L 2924/12041* (2013.01); *H01L 2933/0033* (2013.01); *H01L 2933/0066* (2013.01)

(58) Field of Classification Search
CPC . H01L 2224/83851; H01L 2224/95144; H01L 2224/81815; H01L 2224/83143; H01L 22/14; H01L 2933/0066; H01L 2933/0033; H01L 33/62; H01L 25/0753; H01L 2924/12041; H01L 21/78; H01L 2224/2939; H01L 2224/32225; H01L 24/13; H01L 24/16; H01L 2221/68327
See application file for complete search history.

(56) References Cited

U.S. PATENT DOCUMENTS

| | | | | |
|---|---|---|---|---|
| 2005/0233504 | A1* | 10/2005 | Doi | H01L 21/6835 438/127 |
| 2012/0273935 | A1* | 11/2012 | Martens | H01L 24/13 257/737 |
| 2013/0014386 | A1* | 1/2013 | Baba | H05K 3/3436 29/832 |
| 2016/0049325 | A1* | 2/2016 | Paramio Joves | B25J 11/0095 156/247 |
| 2017/0018472 | A1* | 1/2017 | Takamoto | H01L 23/293 |

FOREIGN PATENT DOCUMENTS

| | | |
|---|---|---|
| CN | 101996892 A | 3/2011 |
| CN | 103647012 A | 3/2014 |

* cited by examiner

ASSEMBLING METHOD, MANUFACTURING METHOD, DEVICE AND ELECTRONIC APPARATUS OF FLIP-DIE

CROSS-REFERENCE TO RELATED APPLICATION

This application is a U.S. national phase under the provisions of 35 U.S.C. § 371 of International Patent Application No. PCT/CN2015/083983 filed Jul. 14, 2015. The disclosures of such international patent application is hereby incorporated herein by reference in its entirety, for all purposes.

FIELD OF THE INVENTION

The present invention relates to the field of manufacturing electronics device, and more specifically, relates to a method for assembling a flip-die, a method for manufacturing a flip-die device, a flip-die device and an electronics apparatus containing the flip-die device.

BACKGROUND OF THE INVENTION

In the flip-chip assembly technique of the prior art, a pick-up head is used to assemble an un-encapsulated die onto a receiving substrate. For example, generally, in the electronics field, an un-encapsulated device that has already been completely formed can be referred to as "die", and an encapsulated device can be referred to as "chip". The un-encapsulated device can, for example, be a semiconductor device. For the clarity reason of description, in the context of this specification, the un-encapsulated flip device (un-encapsulated flip-chip) that has already been completely formed is referred as "flip-die", and the encapsulated flip device can be referred to as "flip-chip".

FIGS. 1A-1E show an example of assembling a die onto a receiving substrate by using a pick-up head.

As shown in FIG. 1A, a die 102 is picked-up by a pick-up head 101. The die 102 is of a flip-structure, in which the bumps thereof are located on one side. As shown in FIG. 1B, flux 104 is coated on the bumps 103 of the die 102. Then, as shown in FIG. 1C, the die 102 is placed on the receiving substrate 105. As shown in FIG. 1D, the bumps 102 are bonded onto the receiving substrate 105 through reflow. In FIG. 1D, underfill 107 is dispensed at the bottom of the die 102 by using a dispenser 106. As shown in FIG. 1E, the underfill 107 is cured, to finish the assembly of the die onto the receiving substrate.

The inventor of this invention has found that in the assembling method of the prior art, dies are picked-up and placed one by one. Thus, for a massive die array/matrix assembly (such as a micro-LED array for display), this approach is time-consuming. Generally, up to a few thousands of units, such as 2,000 units, can be assembled per hour by using a pick-up head. This assembly rate can in turn cause a cost issue.

Furthermore, the inventor of this invention has also found that the size of processed die is limited due to the capability of the pick-up and placement approach. For example, the size of dies that can be picked-up is equal to or larger than 150 μm.

SUMMARY OF THE INVENTION

One object of this invention is to provide a new technical solution for assembling a flip-die.

According to an embodiment of the present invention, there is provided a method for assembling a flip-die, comprising: temporarily bonding the flip-die onto a laser-transparent first substrate, wherein bumps of the flip-die are located on the side of the flip-die opposite to the first substrate; aligning the bumps with pads on a receiving substrate; irradiating the original substrate with laser from the first substrate side to lift-off the flip-die from the first substrate; and attaching the flip-die on the receiving substrate, for finishing the assembling.

Preferably, the method further comprises: forming a device wafer with bumps on one side. Preferably, the step of temporarily bonding the flip-die onto a laser-transparent first substrate further comprises: temporarily bonding the device wafer onto the first substrate on the other side of the flip-die; and singulating the device wafer into the flip-die.

Preferably, the method further comprises: testing the flip-die on the first substrate to determine a known-good-device for lift-off.

Preferably, the step of aligning the bumps with pads on a receiving substrate further comprises: flipping over the first substrate.

Preferably, the step of singulating the device wafer is performed by laser scribing, mechanical blade sawing, or etching.

Preferably, the bumps are solder bumps, and the step of attaching the flip-die on the receiving substrate further comprises: attaching the flip-die on the receiving substrate by using flux.

Preferably, the step of attaching the flip-die on the receiving substrate further comprises: attaching the flip-die on the receiving substrate by means of the action of gravity.

Preferably, the step of attaching the flip-die on the receiving substrate further comprises: attaching the flip-die on the receiving substrate by means of the action of electrostatic force.

Preferably, the electrostatic force is applied by applying voltage to the pads.

Preferably, the flip-die contains magnetic substance, and the step of attaching the flip-die on the receiving substrate further comprises: attaching the flip-die on the receiving substrate by means of the action of electromagnetic force.

Preferably, the bumps are solder bumps, and the method further comprises: reflowing the solder bumps to bond the flip-die with the receiving substrate; and underfilling the bottom of the flip-die.

Preferably, the step of attaching the flip-die on the receiving substrate further comprises: attaching the flip-die on the receiving substrate through an anisotropic conductive layer. Preferably, the method further comprises: processing the anisotropic conductive layer to bond the flip-die with the receiving substrate.

Preferably, the anisotropic conductive layer is at least one of an anisotropic conductive film, an anisotropic conductive paste and an anisotropic conductive tape.

Preferably, the flip-die is temporarily bonded on the first substrate through a temporary bonding layer, and the method further comprising: removing the temporary bonding layer.

According to another embodiment of the present invention, there is provided a method for manufacturing a flip-die device, comprising assembling a flip-die to a receiving substrate by using the method according to the present invention.

According to another embodiment of the present invention, there is provided a flip-die device, which is manufactured by using the method according to the present invention.

According to another embodiment of the present invention, there is provided an electronic apparatus, containing a flip-die device according to the present invention.

In addition, it should be understood by a person skilled in the art that, although a lot of problems exist in the prior art, the solution of each embodiment or each claim could just improve in one or several aspects, and it is not necessary for it to solve all the technical problems listed in the Background of the Invention or in the prior art. It should be understood by a person skilled in the art that content which is not mentioned in a claim should not be regarded as a limitation to said claim.

Further features of the present invention and advantages thereof will become apparent from the following detailed description of exemplary embodiments according to the present invention with reference to the attached drawings.

BRIEF DESCRIPTION OF THE DRAWINGS

The accompanying drawings, which are incorporated in and constitute a part of the specification, illustrate embodiments of the invention and, together with the description thereof, serve to explain the principles of the invention.

DETAILED DESCRIPTION OF THE EMBODIMENTS

Figure 1A:
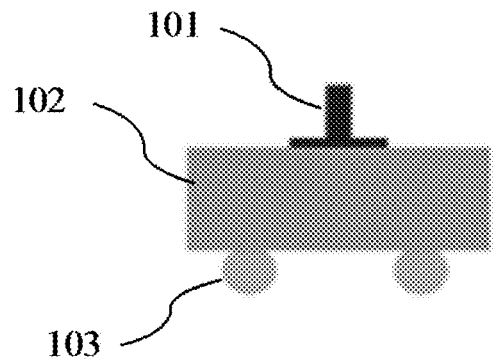
FIGS. 1A-1E (PRIOR ART) show an example of assembling a flip-die of prior art.
Figure 1B:
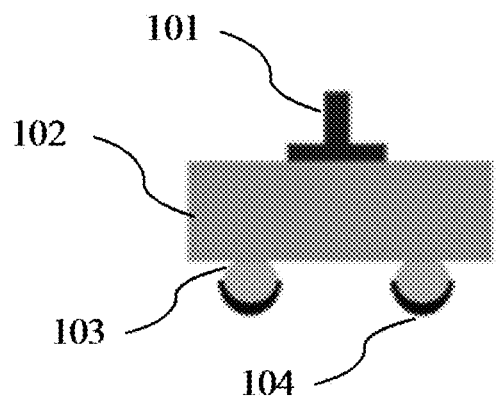
Figure 1C:
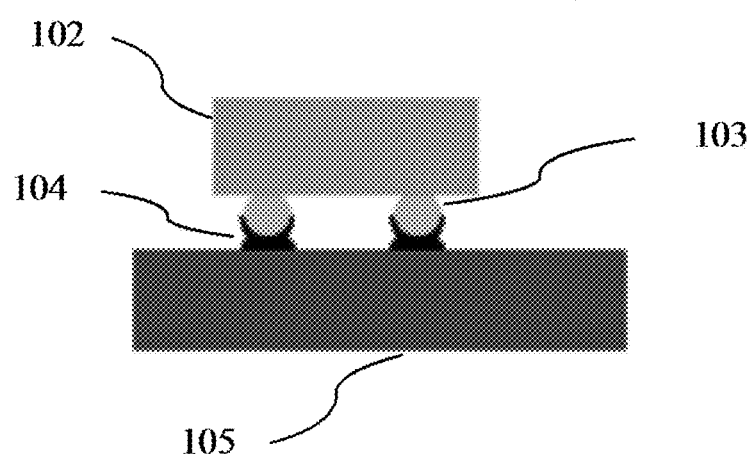
Figure 1D:
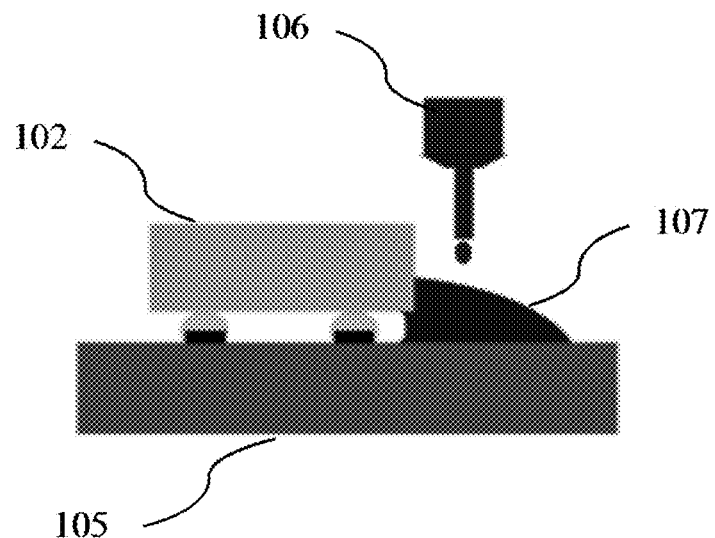
Figure 1E:
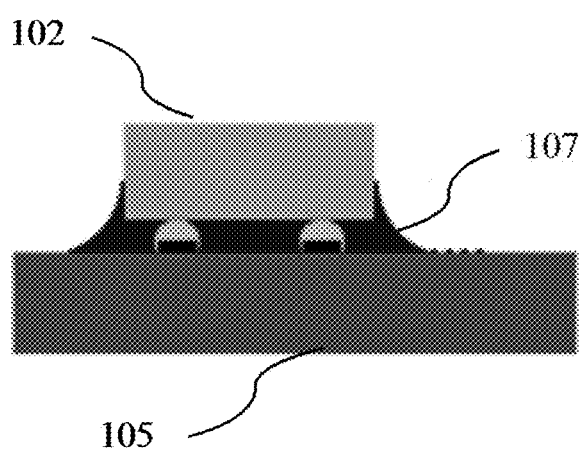

Various exemplary embodiments of the present invention will now be described in detail with reference to the drawings. It should be noted that the relative arrangement of the components and steps, the numerical expressions, and numerical values set forth in these embodiments do not limit the scope of the present invention unless it is specifically stated otherwise.

The following description of at least one exemplary embodiment is merely illustrative in nature and is in no way intended to limit the invention, its application, or uses.

Techniques, methods and apparatus as known by one of ordinary skill in the relevant art may not be discussed in detail but are intended to be part of the specification where appropriate.

In all of the examples illustrated and discussed herein, any specific values should be interpreted to be illustrative only and non-limiting. Thus, other examples of the exemplary embodiments could have different values.

Notice that similar reference numerals and letters refer to similar items in the following figures, and thus once an item is defined in one figure, it is possible that it need not be further discussed for following figures.

Embodiments and examples of the present invention will be described below with reference to the drawings.

Figure 2:
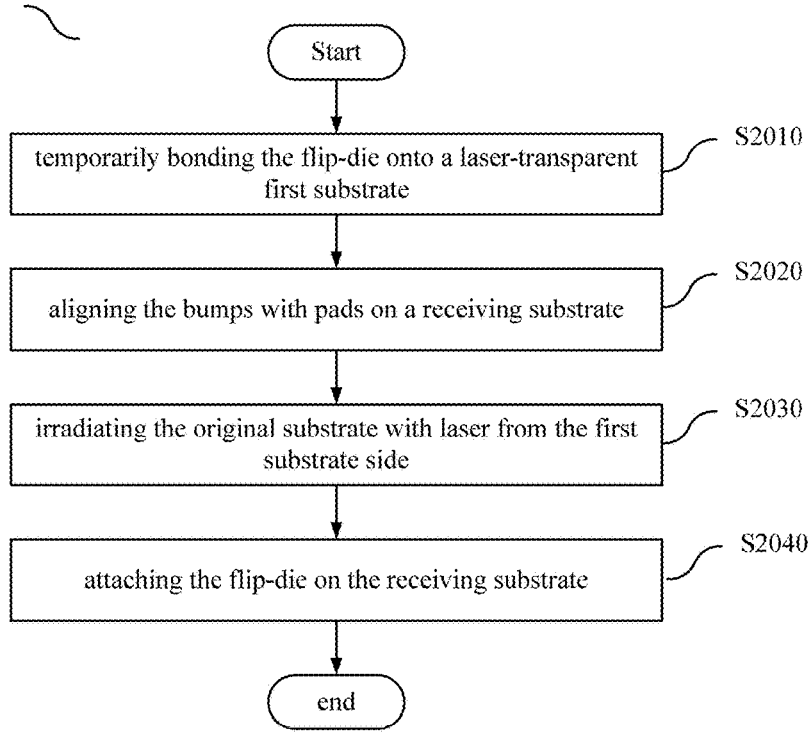
FIG. 2 shows a flow chart of an illustrative embodiment of the method according to the present invention.

FIG. 2 shows a flow chart of an illustrative embodiment of the method for assembling a flip-die according to the present invention.

As shown in FIG. 2, at step S2010, the flip-die is temporarily bonded onto a laser-transparent first substrate. The bumps of the flip-die are located on the side of the flip-die opposite to the first substrate, for assembly onto a receiving substrate. The first substrate is a sapphire substrate, for example.

For example, a device wafer with bumps on one side can be formed in advance. The device wafer is temporarily bonded onto the first substrate on the other side of the flip-die. The device wafer is singulated into the flip-die. For example, the singulation of the device wafer is performed by laser scribing, mechanical blade sawing, or etching.

In an example, the flip-die on the first substrate is tested to determine a known-good-device for lift-off. Since the flip-die can tested on the first substrate rather than a receiving substrate, only a known-good-device can be selectively assembled to the receiving substrate by laser irradiation. In this aspect, the present invention is advantageous.

At step S2020, the bumps are aligned with pads on a receiving substrate.

For example, the first substrate can be flipped over to align the bumps of the flip-die with the pads.

At step S2030, the first substrate is irradiated with laser from the first substrate side to lift-off the flip-die from the first substrate.

Generally, the laser lift-off technology is used in forming a semiconductor device. The laser lift-off technology has not been used in the assembly of dies in the prior art. This is because it is generally deemed that the die forming and the die assembly are two different technologies. For example, in the forming of a die, after the process of lifting-off, other processes such as forming various layers, electrodes and so on thereon will further be performed on a semiconductor wafer. However, for example, for the die assembly, the die is generally a complete chip.

At step S2040, the flip-die is attached on the receiving substrate.

For example, in case that the bumps are solder bumps, the flip-die can be attached on the receiving substrate by using flux. In this case, the step S2040 can be performed before the step S2030.

For example, the flip-die can be attached on the receiving substrate by means of the action of gravity. For example, when the flip-die is lifted-off from the first substrate by using laser, the flip-die is dropped off or is left on the receiving substrate because of the action of gravity.

For example, the flip-die can be attached on the receiving substrate by means of the action of electrostatic force. For example, the electrostatic force can be applied by applying voltage to the pads.

For example, in case that the flip-die contains magnetic substance (for example, the bumps contain magnetic substance), the flip-die can be attached on the receiving substrate by means of the action of electromagnetic force. For example, a magnet can be provided on the bottom of the receiving substrate to provide a suitable electromagnetic field.

In this invention, in case that the bumps are solder bumps, the solder bumps can be reflowed to bond the flip-die with the receiving substrate, and underfilling the bottom of the flip-die.

For example, in this invention, the flip-die can be attached on the receiving substrate through an anisotropic conductive layer. Then, the anisotropic conductive layer is processed to bond the flip-die with the receiving substrate. For example, the anisotropic conductive layer can be at least one of an anisotropic conductive film, an anisotropic conductive paste and an anisotropic conductive tape.

For example, the flip-die can be temporarily bonded on the first substrate through a temporary bonding layer. In this situation, the temporary bonding layer can be removed after the lift-off of the flip-die. However, it shall be understood by a person skilled in the art, the temporary bonding layer is not necessary in every situation. For example, the part that is temporarily bonded with the first substrate can be a part of the flip-die.

Obviously, according the description above, a person skilled in art shall understand that although the steps S2010, S2020, S2030 and S2040 are listed as the above sequence, the steps can be performed in a sequence that is different from it. For example, the flip-die can be attached on the receiving substrate (S2040) before the irradiation of the first substrate with laser (S2030). Furthermore, the flip-die can be bonded on the receiving substrate before the irradiation of the first substrate with laser (S2030).

In another embodiment, the present invention further includes a method for manufacturing a flip-die device. The manufacturing method comprises assembling a flip-die to a receiving substrate by using the method according to the present invention, to form a flip-die device. For example, the receiving substrate is a display screen panel or a display substrate. For example, the flip-die device is a display apparatus.

In another embodiment, the present invention further includes a flip-die device, such as a display screen device or an encapsulated chip. The flip-die device can be manufactured by using the method for manufacturing a flip-die device according to the present invention. A die with smaller size than that of the prior art can be contained in the flip-die device according to the present invention.

In another embodiment, the present invention further includes an electronic apparatus. The electronic apparatus contains a flip-die device according to the present invention. For example, the electronic apparatus can be a mobile phone, a pad computer, a television, a printer and so on.

In the solution of the present invention, compared with the prior art of using a pick-up head, the solution of the present invention can assemble a device of relatively small size. For example, a flip-die smaller than 150 μm (for example, 10 μm) can be assembled. That is, a smaller chip size can be achieved by using the present invention.

Alternatively, compared with the device assembled by the prior art approach, the flip-die assembled by using the present invention can be much thinner. That is, a lower profile can be achieved by using the present invention.

Alternatively, an assemble rate of 200,000 units per hour can be achieved by using the present invention. Therefore, compared with the prior art of using a pick-up head, the assemble rate of the present invention is faster and thus the cost thereof is lower.

The inventor of the present invention has found that the laser lift-off has not been used in the die assembly in the prior art. Furthermore, a person skilled in the art has not conceived the technical effect brought out by such a technology. In another word, there is no stimulation for a person skilled in the art to make such an improve in this aspect.

An example for assembling a flip-die according to the present invention will be described below with reference to FIGS. 3A to 3E.

Figure 3A:
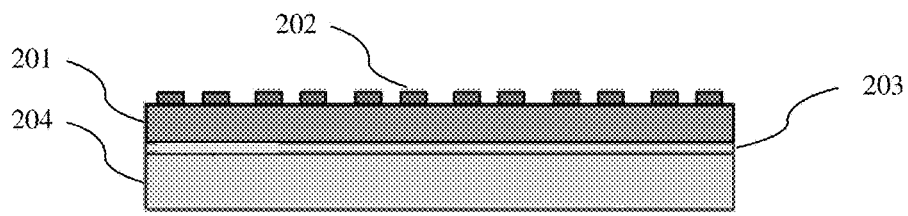
FIGS. 3A-3E show an example of assembling a flip-die according to the present invention.

As shown in FIG. 3A, a device wafer 201 is temporarily bonded with a laser-transparent first substrate 204 such as a sapphire substrate through a temporary bonding layer 203. The device wafer 201 has bumps 202 on the side opposite to the first substrate.

Figure 3B:
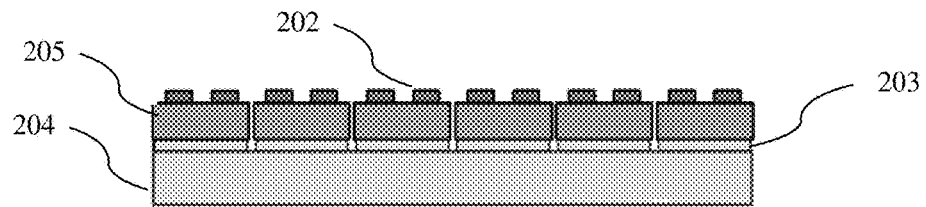

As shown in FIG. 3B, for example, the device wafer 201 is singulated into flip-dies 205 by laser scribing, mechanical blade sawing, or etching such as wet etching or dry etching.

The flip-die 205 on the first substrate can be tested to determine known-good-devices, for assembly onto a receiving substrate.

Figure 3C:
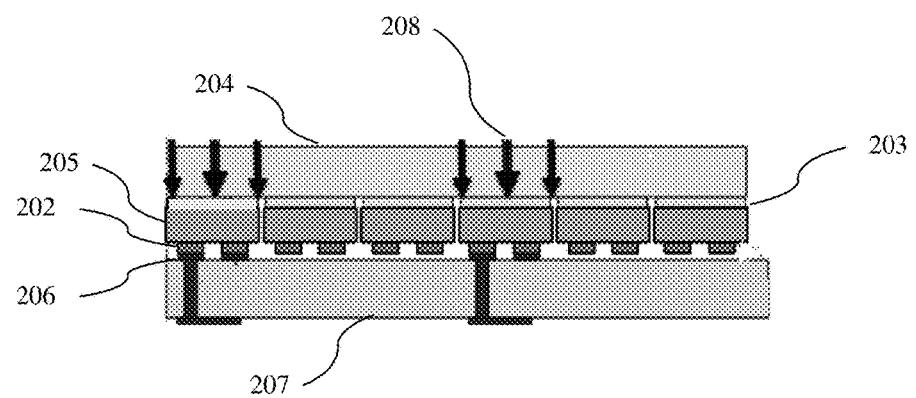
Figure 3D:
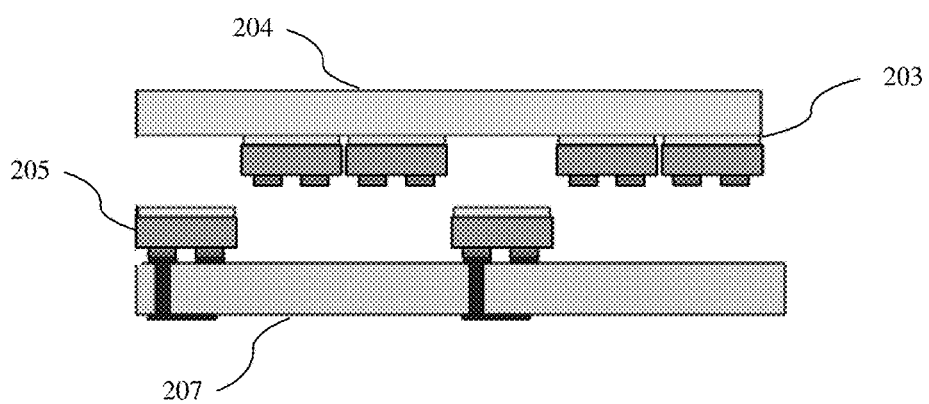
Figure 3E:
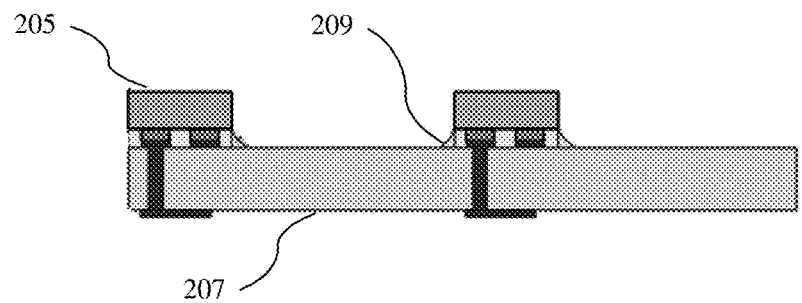

As shown in FIG. 3C, the first substrate 204 is flipped over. Then, the bumps 202 are aligned with the pads 206 on the receiving substrate 207. The flip-die 205 is selectively irradiated with laser 208, to lift-off the flip-die 205.

In this example, the flip-die 205 can be attached onto the receiving substrate 207 before the irradiation of laser. The flip-die 205 can further be bonded onto the receiving substrate 207 before the irradiation of laser.

As shown in 3D, the first substrate 204 is lifted up, leaving the flip-die on the receiving substrate 207.

In case that the bumps are solder bumps, the flip-die 205 can be bonded with the receiving substrate 207 through reflow.

As shown in 3E, the bottom of the flip-die 205 is filled with underfill 209. Then, the underfill 209 is cured.

Another example for assembling a flip-die according to the present invention will be described below with reference to FIG. 4.

Figure 4:
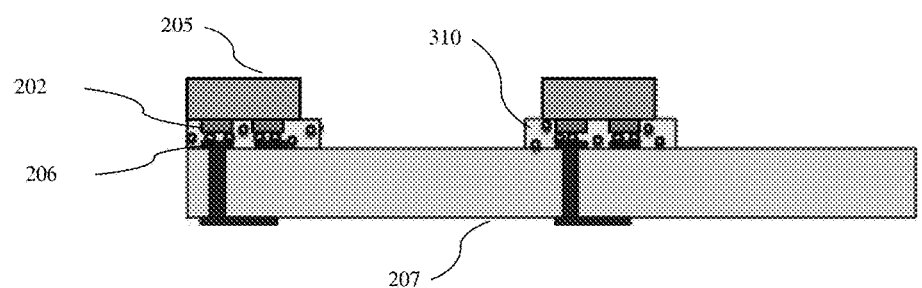
FIG. 4 shows an example of assembling a flip-die according to the present invention.

In the example of FIG. 4, the flip-die 205 are bonded with the receiving substrate 207 through an anisotropic conductive layer. The steps similar with those in FIGS. 3A-3E are omitted in FIG. 4.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. A method for assembling a flip-die, comprising:
   temporarily bonding the flip-die onto a laser-transparent first substrate, wherein bumps of the flip-die are located on the side of the flip-die opposite to the first substrate;
   testing the flip-die on the first substrate to determine a known-good-device for lift-off;
   aligning the bumps with pads on a receiving substrate;
   irradiating the first substrate with laser from the first substrate side to lift-off the flip-die from the first substrate; and
   attaching the flip-die on the receiving substrate for finishing the assembling.

2. The method according to claim 1, wherein the step of aligning the bumps with pads on a receiving substrate further comprises: flipping over the first substrate.

3. The method according to claim 1, wherein the bumps are solder bumps, and the step of attaching the flip-die on the receiving substrate further comprises:
   attaching the flip-die on the receiving substrate by using flux.

4. The method according to claim 1, wherein the step of attaching the flip-die on the receiving substrate further comprises: attaching the flip-die on the receiving substrate by means of the action of gravity.

5. The method according to claim 1, wherein the flip-die contains magnetic substance, and the step of attaching the flip-die on the receiving substrate further comprises: attaching the flip-die on the receiving substrate by means of the action of electromagnetic force.

6. The method according to claim 1, wherein the bumps are solder bumps, and the method further comprises:

reflowing the solder bumps to bond the flip-die with the receiving substrate; and underfilling the bottom of the flip-die.

7. The method according to claim 1, wherein the flip-die is temporarily bonded on the first substrate through a temporary bonding layer, and the method further comprising: removing the temporary bonding layer.

8. The method according to claim 1, further comprising: forming a device wafer with bumps on one side;

wherein the step of temporarily bonding the flip-die onto a laser-transparent first substrate further comprises:

temporarily bonding the device wafer onto the first substrate on the other side of the flip-die; and singulating the device wafer into the flip-die.

9. The method according to claim 8, wherein the step of singulating the device wafer is performed by laser scribing, mechanical blade sawing, or etching.

10. The method according to claim 1, wherein the step of attaching the flip-die on the receiving substrate further comprises: attaching the flip-die on the receiving substrate by means of the action of electrostatic force.

11. The method according to claim 10, wherein the electrostatic force is applied by applying voltage to the pads.

12. The method according to claim 1, wherein the step of attaching the flip-die on the receiving substrate further comprises: attaching the flip-die on the receiving substrate through an anisotropic conductive layer;

wherein the method further comprises: processing the anisotropic conductive layer to bond the flip-die with the receiving substrate.

13. The method according to claim 12, wherein the anisotropic conductive layer is at least one of an anisotropic conductive film, an anisotropic conductive paste and an anisotropic conductive tape.

14. A method for manufacturing a flip-die device, comprising assembling a flip-die to a receiving substrate by using the method according to claim 1.

15. A flip-die device, which is manufactured by using the method according to claim 14.

* * * * *